United States Patent [19]

Ishizuka

[11] Patent Number: 5,410,247
[45] Date of Patent: Apr. 25, 1995

[54] CIRCUIT DEVICE HAVING A TEST FUNCTION FOR CHECKING CIRCUIT OPERATION

[75] Inventor: Keiji Ishizuka, Kanagawa, Japan

[73] Assignee: Canon Kabushiki Kaisha, Tokyo, Japan

[21] Appl. No.: 11,117

[22] Filed: Jan. 29, 1993

Related U.S. Application Data

[63] Continuation of Ser. No. 681,125, Apr. 5, 1991, abandoned.

[30] Foreign Application Priority Data

Apr. 26, 1990 [JP] Japan .................. 2-108908

[51] Int. Cl.$^6$ .................................. G01R 31/28
[52] U.S. Cl. ................... 324/158.1; 324/763; 371/22.5
[58] Field of Search .............. 324/158 R, 73.1, 763; 371/15.1, 22.3, 22.6, 16.1, 25.1, 27, 22.5; 307/303, 303.1, 242

[56] References Cited

U.S. PATENT DOCUMENTS

| | | | |
|---|---|---|---|
| 3,614,608 | 10/1971 | Giedd et al. | 324/73.1 |
| 4,584,683 | 4/1986 | Shimizu | 371/25.1 |
| 4,788,684 | 11/1988 | Kawaguchi et al. | 371/27 |
| 4,972,144 | 11/1990 | Lyon et al. | 324/73.1 |
| 5,132,614 | 7/1992 | Sakumoto et al. | 324/158 R |
| 5,198,760 | 3/1993 | Farwell | 324/158 R |

Primary Examiner—Vinh Nguyen
Attorney, Agent, or Firm—Robin, Blecker, Daley & Driscoll

[57] ABSTRACT

A circuit device including a DC characteristic test circuit is arranged to have a reset signal supplied via a reset signal input terminal for resetting a testee circuit to be subjected to a DC characteristic test; and to include an output buffer circuit which receives a predetermined output signal of the testee circuit and the reset signal supplied from the reset signal input terminal. The arrangement enables the DC characteristic test to be quickly carried out on the circuit device at a low cost and without increasing the number of terminals required for the test.

11 Claims, 3 Drawing Sheets

| A | B | EXNOR |
|---|---|---|
| L | L | H |
| L | H | L |
| H | L | L |
| H | H | H |

CIRCUIT DEVICE HAVING A TEST FUNCTION FOR CHECKING CIRCUIT OPERATION

This is a continuation application under 37 CFR 1.62 of prior application Ser. No. 681,125, filed Apr. 5, 1991, now abandoned.

BACKGROUND OF THE INVENTION

1. Field of the Invention

This invention relates to a circuit device which includes a direct-current characteristic test circuit.

2. Description of the Related Art

The direct-current characteristic test (hereinafter referred to as DC test) of LSIs (large scale integrated circuits) has heretofore been conducted by test methods called a $V_{OL}$ test and a $V_{OH}$ test. In conducting the DC test, voltage variation's are measured by allowing a load current to flow under a condition that a high level signal (in the case of the $V_{OH}$ test) or a low level signal (in the case of the $V_{OL}$ test) is caused to be output from an arbitrary output pin. In cases where there is no special DC test circuit within the LSI, therefore, it is necessary to apply clock signals 1, 2 ..., n to a plurality of input pins 2a, 2b, ..., 2n disposed on the device 1 under the DC test (hereinafter referred to as the DUT) for the purpose of making the level of a signal output from an output pin 3 high or low, as shown in FIG. 1 of the accompanying drawings. In such a case, the DC test has been troublesome. Further, even in cases where a special circuit is provided within the LSI for DC-testing the DUT 21, as represented by parts 24 to 27 in FIG. 2, it has been necessary to have input pins 22a and 22b arranged to receive a signal TEST-CONTROL for switching the circuit action between a DC test operation and an ordinary operation and a signal TEST-DATA for setting the signal output from an output pin 23 at a high level or at a low level. To meet this requirement, therefore, the number of pins of the LSI must be increased.

SUMMARY OF THE INVENTION

It is an object of this invention to provide a circuit device which is capable of solving the above-stated problems.

It is another object of the invention to provide a circuit device which enables the DC characteristic test of a circuit to be speedily carried out at a low cost without increasing the number of terminals for the test.

Under this object, a circuit device including a circuit for a DC characteristic test comprises a testee circuit to be subjected to the DC characteristic test; a reset signal input terminal arranged to receive a reset signal for resetting the testee circuit and to supply the reset signal to the testee circuit; and an output buffer circuit arranged to receive a predetermined output signal of the testee circuit and the reset signal supplied from the reset signal input terminal.

The above and other objects and features of the invention will become apparent from the following detailed description of embodiments thereof taken in conjunction with the accompanying drawings.

DETAILED DESCRIPTION OF THE PREFERRED EMBODIMENT

Figure 1:
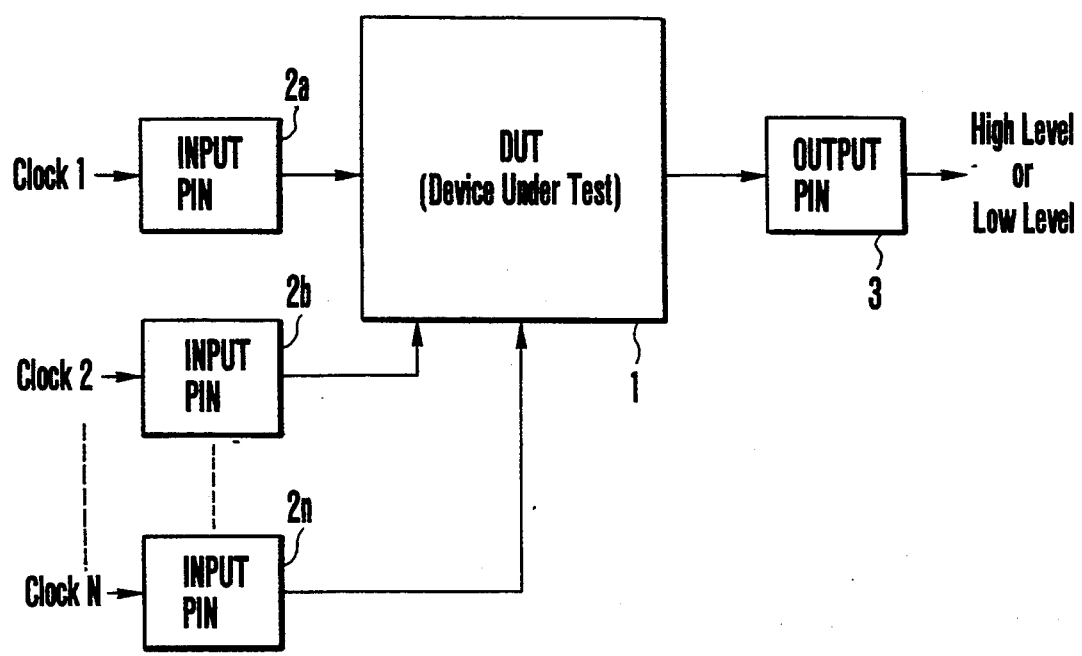
FIG. 1 is a block diagram showing the conventional DC test arrangement for the LSI of the kind having no DC test circuit included therein.
Figure 2:
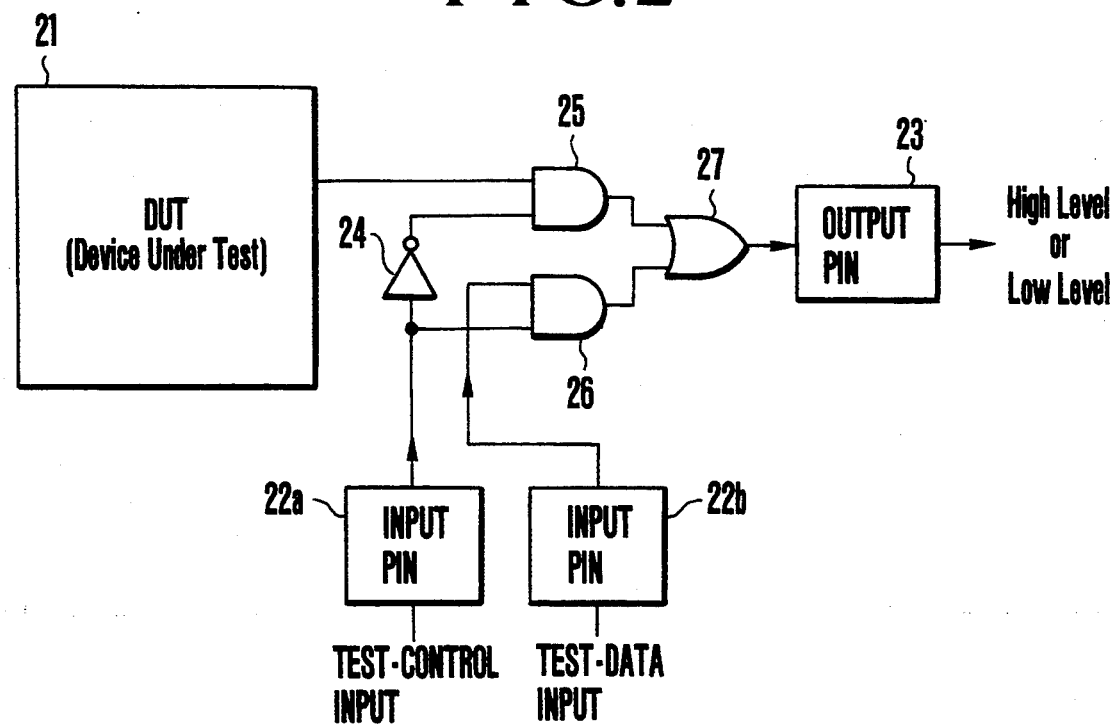
FIG. 2 is a block diagram showing the conventional DC test arrangement for the LSI of the kind including a DC test circuit therein.
Figure 3:
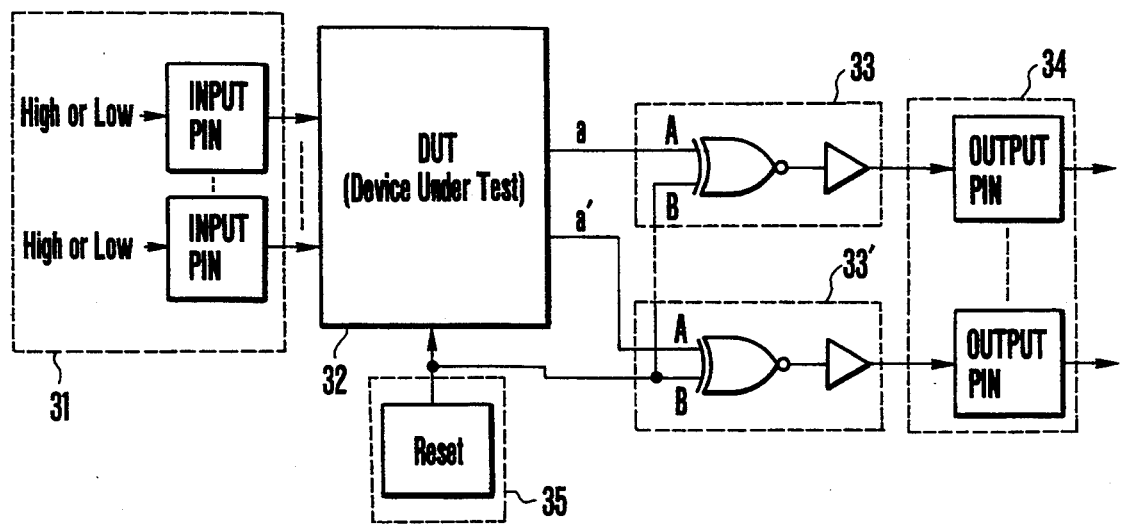
FIG. 3 is a block diagram showing in outline the arrangement of an LSI including therein a DC test circuit which is arranged according to this invention as an embodiment thereof.
Figure 4:
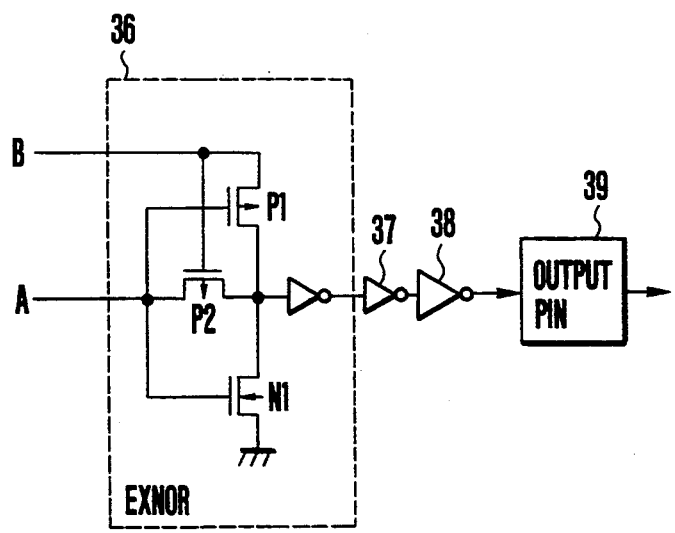
FIG. 4 is a circuit diagram showing the equivalent circuit of an output buffer 33 of FIG. 3.
Figures 5, 6:
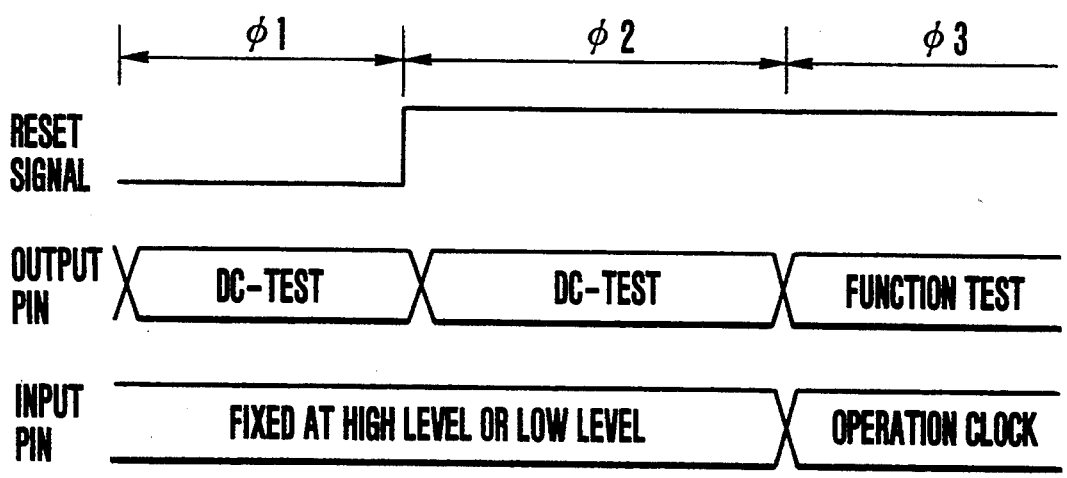
FIG. 5 shows the truth table of an EXNOR gate of the output buffer 33 of FIG. 3.
FIG. 6 is a timing chart showing the test action of the arrangement shown in FIG. 3.

The following describes the details of this invention through an embodiment thereof:

FIG. 3 shows in outline the arrangement of an LSI which includes a DC test circuit and is arranged as an embodiment of the invention. FIG. 4 shows the equivalent circuit of an output buffer 33 shown in FIG. 3. FIG. 5 shows the truth table of an EXNOR gate of the output buffer 33 of FIG. 3.

Referring to FIG. 3, the illustration includes an input pin 31; a circuit or a circuit block 32 (hereinafter referred to as the DUT: device under test) which is to be subjected to the DC test; output buffers 33 and 33'; an output pin 34; and a system reset pin 35 which is provided for the DUT 32. A reset signal to be supplied to the system reset pin 35 is of a so-called low-active type. In other words, the DUT 32 is arranged to be reset when receiving a low-level reset signal. In FIG. 4, a reference numeral 36 denotes an exclusive NOR gate (hereinafter referred to as an EXNOR gate). Numerals 37 and 38 denote inverters. A numeral 39 denotes an output pin which is equivalent to the output pin 34 of FIG. 3. These elements 36 to 38 form each of the output buffers 33 and 33' shown in FIG. 3.

With the embodiment arranged as shown in FIG. 3, when the level of the system reset pin 35 is at a low level while the input pin 31 is fixed at a high or low level, the level of the output a or a' of the DUT 32 is also fixed at a high or low level. Since the arrangement of the DUT 32 is known to a tester, whether the output a or a' is at a high level or at a low level is also known to the tester. Assuming that the output a is at a high level, the level of the input terminal A of the EXNOR gate also becomes a high level. Further, since the system reset pin 35 is at a low level as mentioned above, another input terminal B of the EXNOR gate is at a low level. Therefore, a low-level output, which is obtained by inverting the input to the input terminal A of the EXNOR gate of the output buffer 33, is supplied to the output pin 34 in accordance with the truth table of the EXNOR gate which is shown in FIG. 5. At this time, therefore, the DC test, i.e., the $V_{OL}$ test, is performed.

Next, when the level of the system reset pin 35 becomes a high level, a high-level output which is equal to the level of the input terminal A of the EXNOR gate is supplied to the output pin 34 according to the truth table of the EXNOR gate shown in FIG. 5. At that time, therefore, the DC test, i.e., the $V_{OH}$ test, is performed. FIG. 6 is a timing chart showing the timing of the above-stated test action. Referring to FIG. 6, the level of the system reset pin 35 is set at a low level to conduct the $V_{OL}$ or $V_{OH}$ test during a period $\phi 1$. During a next period $\phi 2$, the $V_{OH}$ or $V_{OL}$ test is conducted by changing the level of the system reset pin 35 to a high level to invert the output of the output pin 39 of FIG. 4 obtained during the above-stated period $\phi 1$. During a period $\phi 3$ and thereafter, either a function test or an ordinary operation is performed as desired.

In the case of this embodiment, as mentioned above, the output buffers 33 and 33', each of which has the EXNOR gate 36 arranged to receive the reset signal from the system reset pin 35 as one of two inputs thereof, are disposed between the output terminal of the DUT 32 and the output pin 34. Therefore, regardless of whether the output level of the DUT 32 is high or low, the level of the signal output from the output pin 39 can be changed from a high level over to a low level and vice versa on the basis of the level of the reset signal of the system reset pin 35 in accordance with the truth table of the EXNOR gate shown in FIG. 5.

In the case of this embodiment, the reset signal supplied to the system reset pin 35 is arranged to be of the low-active type. However, in a case where the reset signal is arranged to be of a so-called high-active type, the inverter 37 shown in FIG. 4 can be omitted.

The arrangement described above permits the DC test to be conducted on the DUT included in the LSI by utilizing the system reset pin which is provided on the LSI. The arrangement obviates the necessity of any special signal input pin for the DC test. Therefore, the number of pins does not have to be increased. Further, since the DC test is conducted within two clock periods $\phi 1$ and $\phi 2$, the test can be completed in a short period of time. With an EXNOR gate arranged in the manner as represented by the equivalent circuit shown in FIG. 4, when the level of a signal supplied to an input terminal B changes from a low level to a high level, the level of the input signal from the input terminal B might be caused to fluctuate by an electric charge obtained at the inverter 37. However, in the case of this embodiment, this presents no serious problem, because a reset signal is arranged to be supplied from the system reset pin 35 to the input terminal B of the EXNOR gate and, in this case, the signal supplied to the input terminal B is deemed to be a constant DC voltage. Further, again referring to FIG. 4, since the EXNOR gate is composed of a total of three transistors including two MOS transistors forming the inverter, the provision of the output buffer within the LSI presents no problem in respect of space and causes no difficulty in terms of layout.

The embodiment described above uses the EXNOR gate as the DC test circuit. However, this invention is not limited to the use of the EXNOR gate. An exclusive OR (EXOR) gate may be employed in place of the EXNOR gate. In this instance, the DC test can be conducted, in the same manner as in the case of the EXNOR gate, irrespectively of the high level or low level of the output of the DUT 32 within the LSI, by carrying out a high/low changeover action on the level of the reset signal supplied to the system reset pin 35 to change the level of the output of the output pin 34 between a high level and a low level.

Further, in the case of this embodiment, the DC test circuit (an EXNOR gate, for example) is included in each of the output buffers 33 and 33'. However, this may be changed to insert the DC test circuit in a specific part of the circuit within the LSI in such a way as to make the high/low change-over of the level of the signal output from the output pin 34 according to the level of the reset signal supplied from the system reset pin.

In accordance with this invention, as described in the foregoing, the DC test circuit can be arranged within an LSI without increasing the number of special pins. Further, since only one clock pulse is required in setting the output level at a high or low level for the DC test, the DC test can be completed in a short period of time and a test program can be easily prepared.

Further, since the DC test circuit can be arranged within the LSI without increasing the number of special pins for the DC test and without excessively increasing the area of the chip, the DC test circuit causes almost no increase in cost.

Further, since the level setting action on the output of the LSI for the DC test can be performed by using the signal of an output terminal disposed at a specific part of a circuit within the LSI, the DC test can be performed including a part of a function test. Therefore, with the $V_{OL}$ test and the $V_{OH}$ test arranged to be performed in the beginning of a test program, the length of time required in carrying out a faulty-chip sorting-out process can be shortened.

What is claimed is:

1. A circuit device having a self-test function, comprising:
   (A) a first circuit subjected to a testing operation, said first circuit having a first group of input terminals including a reset signal input terminal and a first group of output terminals; and
   (B) a second circuit for testing the operation of said first circuit, having a second group of input terminals for receiving a signal output from an output terminal used for testing the operation of said first circuit and a reset signal to be supplied to the reset signal input terminal, and having a second group of output terminals, said second circuit being arranged to form and output an output signal according to the signal output from the output terminal used for testing the operation of said first circuit and the reset signal to be supplied to said reset signal input terminal of said first circuit.

2. A device according to claim 1, wherein said second circuit includes an Exclusive NOR Gate for receiving the signal output from the output terminal used for testing the operation of said first circuit and the reset signal to be supplied to said reset terminal of said first circuit.

3. A device according to claim 1, wherein said circuit device composed of the first circuit and the second circuit is composed of a Large Scale Integrated Circuit.

4. A device according to claim 1, wherein said first circuit is arranged to output a signal corresponding to a level of the signal to be supplied to said first group of input terminals to the output terminal used for testing the operation of the first circuit and to supply the same to said second circuit.

5. A device according to claim 4, wherein said second circuit is arranged to outputs, from said second group of output terminals, a signal corresponding to a level of the reset signal fed to said reset signal input terminal of said first circuit.

6. A device according to claim 1, wherein said first circuit is arranged to come into a reset state in the case where a low level reset signal is fed to said reset signal input terminal of said first circuit.

7. A device according to claim 6, wherein said second circuit is arranged to output the reset signal fed to said reset signal input terminal of said first circuit, from said second group of output terminals through two inverters connected in series.

8. A device according to claim 6, wherein said second circuit includes an Exclusive NOR Gate for receiving the signal output from the output terminal used for testing the operation of said first circuit and the reset signal to be supplied to said reset signal input terminal of said first circuit and two inverters connected in series for outputting a signal corresponding to a level of a signal output from said Exclusive NOR Gate.

9. A device according to claim 1, wherein said first circuit is arranged to come into a reset state in the case where a high level reset signal is input to said reset signal input terminal.

10. A device according to claim 9, wherein said second circuit is arranged to output a signal corresponding to a level of the reset signal fed to said reset signal input terminal of said first circuit from said second group of output terminals through a single inverter.

11. A device according to claim 9, wherein said second circuit includes an Exclusive NOR Gate for receiving the signal output from the output terminal used for testing the operation of said first circuit, and one inverter for outputting a signal corresponding to a level of signal output from said Exclusive NOR Gate.

* * * * *

UNITED STATES PATENT AND TRADEMARK OFFICE
CERTIFICATE OF CORRECTION

PATENT NO. : 5,410,247
DATED : April 25, 1995
INVENTOR(S) : Keiji Ishizuka

It is certified that error appears in the above-indentified patent and that said Letters Patent is hereby corrected as shown below:

Col. 4, line 56. Change "outputs" to -- output --.

Signed and Sealed this

Twenty-fifth Day of July, 1995

Attest:

BRUCE LEHMAN

Attesting Officer     Commissioner of Patents and Trademarks